United States Patent
Kolman et al.

[11] Patent Number: 6,016,006
[45] Date of Patent: *Jan. 18, 2000

[54] THERMAL GREASE INSERTION AND RETENTION

[75] Inventors: Frank Kolman, Phoenix; Michael Brownell, Chandler, both of Ariz.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/850,440

[22] Filed: May 5, 1997

Related U.S. Application Data

[63] Continuation of application No. 08/671,794, Jun. 24, 1996, abandoned.

[51] Int. Cl.[7] .................................................. H01L 23/42
[52] U.S. Cl. ..................... 257/712; 257/717; 438/122; 438/125; 361/713; 361/719; 361/705
[58] Field of Search .................................. 257/712, 714, 257/718, 717; 361/709, 717, 714, 718, 722, 705, 713, 719; 438/125, 126, 122

[56] References Cited

U.S. PATENT DOCUMENTS

| | | | |
|---|---|---|---|
| 3,993,123 | 11/1976 | Chu et al. | 257/714 |
| 4,034,469 | 7/1977 | Koopman et al. | 257/714 |
| 4,092,697 | 5/1978 | Spaight | 257/697 |
| 4,226,281 | 10/1980 | Chu | 257/714 |
| 4,235,283 | 11/1980 | Gupta | 257/714 |
| 4,514,752 | 4/1985 | Engel et al. | 257/697 |
| 4,531,146 | 7/1985 | Cuzchaw | 257/714 |
| 4,639,829 | 1/1987 | Ostergren et al. | 257/713 |
| 4,933,747 | 6/1990 | Schroeder | 257/714 |
| 5,184,211 | 2/1993 | Fox | 257/713 |
| 5,323,292 | 6/1994 | Brzezinski | 257/714 |

FOREIGN PATENT DOCUMENTS

| | | | |
|---|---|---|---|
| 63-219143 | 9/1988 | Japan | 257/704 |

*Primary Examiner*—John Guay
*Attorney, Agent, or Firm*—Blakely, Sokoloff, Taylor & Zafman LLP

[57] ABSTRACT

An integrated circuit package. The package includes an integrated circuit that is mounted to a substrate. The integrated circuit is enclosed by a cover plate that is attached to the substrate. The cover plate is separated from the integrated circuit by a small space. The cover plate has a pair of ports which allow a thermal grease to be injected into the space between the integrated circuit and the cover plate. The package has a seal that extends around the integrated circuit between the cover plate and the substrate. The seal controls and confines the thermal grease to an area immediately adjacent to the integrated circuit.

3 Claims, 1 Drawing Sheet

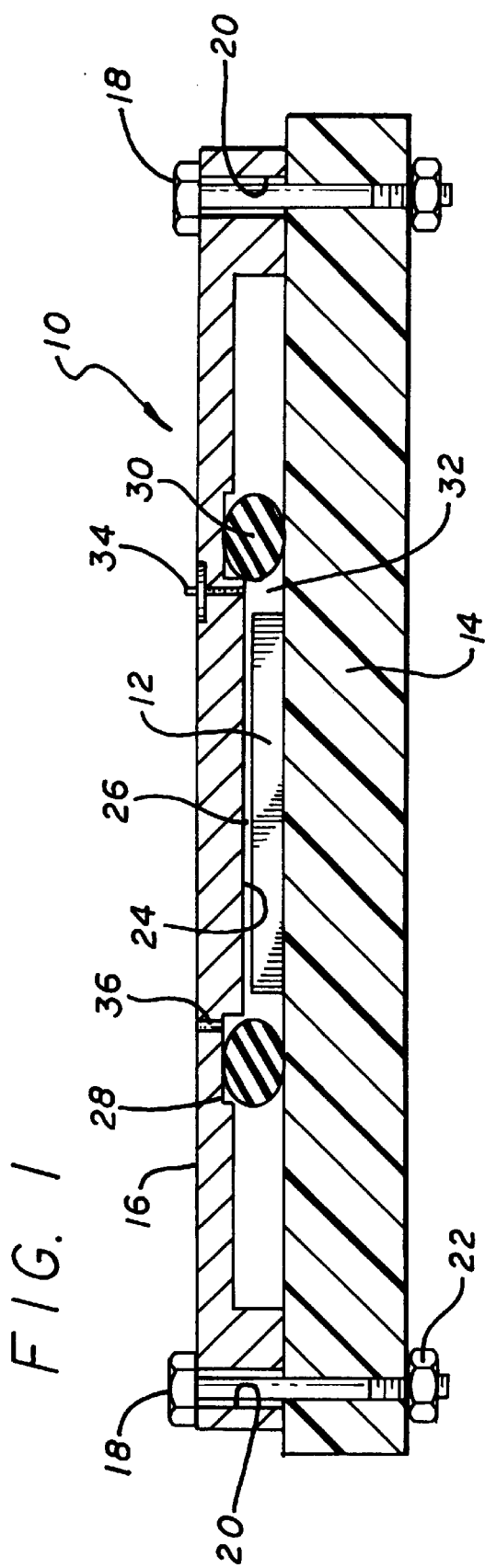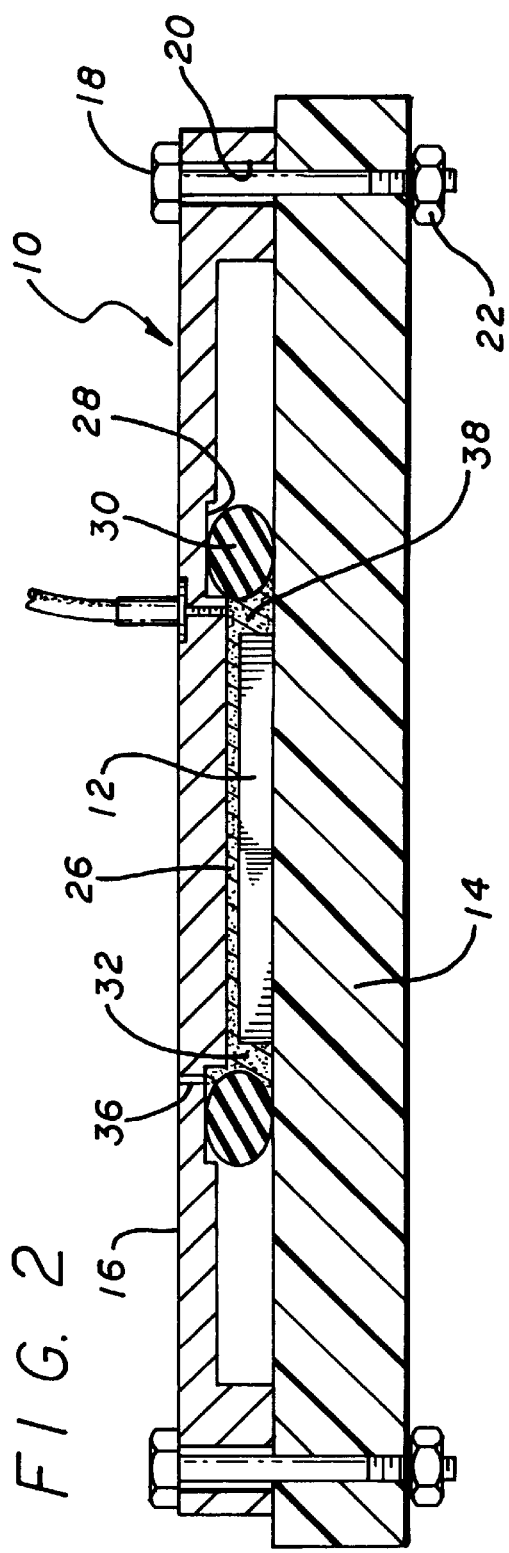

THERMAL GREASE INSERTION AND RETENTION

This is a Continuation Application of application Ser. No. 08/671,794, filed Jun. 24,1996, and now abandoned.

BACKGROUND OF THE INVENTION

1. Field of the Invention

The present invention relates to an integrated circuit package.

2. Description of the Related Art

Integrated circuits are typically housed within a package that is mounted to a printed circuit board. The integrated circuits generate heat which must be removed from the package. Some packages incorporate heat slugs or heat sinks to facilitate the removal of heat from the integrated circuits. The heat sinks are coupled to the integrated circuits to provide a direct thermal path between the die and the ambient of the package. Because of manufacturing tolerances there may exist air gaps or air pockets between the integrated circuit and the heat sinks. Air is a poor thermal conductor. A layer of thermal grease is therefore typically applied to the top of the integrated circuit to provide a relatively low thermal impedance between the circuit and the heat sink.

To minimize the thermal impedance of the package it is desirable to control the application of the thermal grease. Too much thermal grease will unduly increase the thermal impedance of the package and the junction temperatures of the integrated circuit. An insufficient amount of thermal grease may leave air gaps and pockets that also increase the thermal impedance of the package. It is therefore desirable to provide an integrated circuit package that has a controlled layer of thermal grease.

SUMMARY OF THE INVENTION

The present invention is an integrated circuit package. The package includes an integrated circuit that is mounted to a substrate. The integrated circuit is enclosed by a cover plate that is attached to the substrate. The cover plate is separated from the integrated circuit by a small space. The cover plate has a pair of ports which allow a thermal grease to be injected into the space between the integrated circuit and the cover plate. The package has a seal that extends around the integrated circuit between the cover plate and the substrate. The seal controls and confines the thermal grease to an area immediately adjacent to the integrated circuit.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 1 is a cross-sectional view of an integrated circuit package of the present invention;

FIG. 2 is a cross-sectional view similar to FIG. 1 showing a thermal grease being injected into the package.

DETAILED DESCRIPTION OF THE INVENTION

Referring to the drawings more particularly by reference numbers, FIG. 1 shows an integrated circuit package 10 of the present invention. The package 10 houses an integrated circuit 12. The integrated circuit 12 may be a microprocessor. Although an integrated circuit is shown and described, it is to be understood that the package may contain any electrical device.

The integrated circuit 12 is mounted to a substrate 14. The substrate 14 may be a printed circuit board which has surface pads, internal routing and vias (not shown) that couple the integrated circuit 12 to an external printed circuit board. The integrated circuit 12 may have solder bumps (not shown) that couple the circuit 12 to the substrate 14 in a process that is commonly referred to as "C4" or "flip chip" packaging.

The integrated circuit 12 is enclosed by a cover plate 16 that is attached to the substrate 14. The cover plate 16 can be attached to the substrate 14 by a plurality of bolts 18. The bolts 18 extend through clearance holes 20 of the plate 16 and are fastened by nuts 22. The cover plate 16 is typically constructed from a thermally conductive metal material such as copper to transfer the heat generated by the integrated circuit 12 to the ambient of the package 10. The cover plate 16 thus functions as both a protective cover and a heat sink for the package 10.

The cover plate 16 has a platen surface 24 that is separated from the top surface of the integrated circuit 12 by a space 26. The cover plate 16 also has an annular groove 28 that is located adjacent to the platen surface 24. The package 10 has a seal 30 that is located within the annular groove 28. The seal 30 encloses the integrated circuit 12 and defines a thermal area 32 adjacent to the circuit 12. In the preferred embodiment, the seal 30 is an 0-ring that is deflected by the cover plate 16. The cover plate 16 also has an inlet port 34 and an outlet port 36.

As shown in FIG. 2, a thermal grease 38 is injected into the open area 32 of the package 10. The thermal grease 38 is pumped into the area 32 until the grease 38 fills the space 26 between the cover plate 16 and the integrated circuit 12. The outlet port 36 allows the air within the thermal area 32 to flow out of the package so that air pockets are not formed in the interface between the integrated circuit 12 and the cover plate 16. The seal 30 controls the flow of thermal grease 38 so that the grease 38 fully occupies the space 26 between the cover plate 16 and the integrated circuit 12.

The present invention thus provides a means to control the thickness of a layer of thermal grease located between an integrated circuit 12 and a heat sink 16. Although a package is shown and described, the substrate and cover may be used as a tool to apply a uniform layer of thermal grease on an integrated circuit that is subsequently assembled into another package. For example, after the thermal grease is applied, the cover plate 16 can be detached and the grease covered integrated circuit 12 can be removed to be assembled into a package such as a ceramic or plastic molded packages known in the art. Although a thermal grease is described, it is to be understood that the grease may be a thermally conductive epoxy or another thermally conductive material that can be injected into the thermal area 32 of the package 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method for applying a thermal grease to an integrated circuit, comprising the steps of:
   a) placing an integrated circuit onto a substrate;
   b) placing a seal onto said substrate around said integrated circuit;
   c) enclosing said integrated circuit with a cover plate such that said integrated circuit, said plate and said seal define a thermal area; and,
   d) injecting a thermal grease into said thermal cavity through an inlet port of said cover plate so that said thermal grease is in contact with said integrated circuit, said cover plate and said seal.

2. The method as recited in claim 1, wherein said seal is deflected by said cover plate.

3. The method as recited in claim 2, wherein said cover plate is fastened to said substrate.

* * * * *